(12) United States Patent
Noguchi et al.

(10) Patent No.: US 10,502,767 B2
(45) Date of Patent: Dec. 10, 2019

(54) ELECTRIC CURRENT DETECTION DEVICE AND ELECTRIC CURRENT DETECTION METHOD

(71) Applicant: Hitachi Metals, Ltd., Tokyo (JP)

(72) Inventors: Masaki Noguchi, Yokkaichi (JP); Naoki Futakuchi, Hitachinaka (JP); Ken Okuyama, Hitachi (JP)

(73) Assignee: HITACHI METALS, LTD., Tokyo (JP)

(*) Notice: Subject to any disclaimer, the term of this patent is extended or adjusted under 35 U.S.C. 154(b) by 0 days.

(21) Appl. No.: 15/517,676

(22) PCT Filed: Oct. 10, 2014

(86) PCT No.: PCT/JP2014/077247
§ 371 (c)(1),
(2) Date: Apr. 7, 2017

(87) PCT Pub. No.: WO2016/056137
PCT Pub. Date: Apr. 14, 2016

(65) Prior Publication Data
US 2017/0315157 A1    Nov. 2, 2017

(51) Int. Cl.
*G01R 15/20* (2006.01)
(52) U.S. Cl.
CPC .................. *G01R 15/207* (2013.01)
(58) Field of Classification Search
CPC ................................................. G01R 15/207
See application file for complete search history.

(56) References Cited

U.S. PATENT DOCUMENTS

2011/0221436 A1* 9/2011 Ichinohe .............. G01R 15/205
324/252
2014/0218018 A1* 8/2014 Ivanov .................... G01R 33/02
324/247

FOREIGN PATENT DOCUMENTS

JP          2012-225872 A     11/2012

OTHER PUBLICATIONS

International Search Report and Written Opinion issued in the corresponding application PCT/JP2014/077247 dated Dec. 22, 2014.
IPRP in related International Application No. PCT/JP2014/077247 dated Apr. 20, 2017.

(Continued)

*Primary Examiner* — Patrick Assouad
*Assistant Examiner* — Feba Pothen
(74) *Attorney, Agent, or Firm* — Roberts Mlotkowski Safran Cole & Calderon P.C.

(57) ABSTRACT

An electric current detection device includes magnetism detector elements for detecting a strength of a magnetic field generated by an electric current flowing through an electric current path, a detection circuit for detecting a magnitude of an electric current flowing through the electric current path based on an output of the magnetism detector elements, and plural wires that are connected to the magnetism detector elements and extend in a direction away from the electric current path. The magnetism detector elements are arranged such that a direction of a magneto-sensitive axis thereof lies on a first plane parallel to a current-carrying direction of the electric current path and parallel to an extending direction of the plurality of wires. The plural wires are arranged on a same plane of a second plane orthogonal to the first plane.

8 Claims, 9 Drawing Sheets

(56) References Cited

OTHER PUBLICATIONS

Chinese Office Action issued in corresponding Chinese Application No. 201480082603. 9 dated Oct. 9, 2018.
Office Action issued in corresponding Chinese Application No. 201480082603.9 dated Apr. 8, 2019.

* cited by examiner

ELECTRIC CURRENT DETECTION DEVICE AND ELECTRIC CURRENT DETECTION METHOD

CROSS-REFERENCE TO RELATED APPLICATIONS

The present application is a U.S. National Phase of PCT/JP2014/077247 filed on Oct. 10, 2014. The disclosure of the PCT Application is hereby incorporated by reference into the present Application.

TECHNICAL FIELD

The present invention relates to an electric current detection device and an electric current detection method for detecting an electric current flowing through an electric current path by using magnetism detector elements.

BACKGROUND ART

In the field of, e.g., motor drive technology, etc., for hybrid cars or electric cars, etc., a relatively large current is used and there is thus a demand for electric current detection devices capable of non-contact measurement of a high current. Some of such electric current detection devices use a magnetism detector element(s) to detect strength of a magnetic field generated by an electric current to be measured, thereby detecting the magnitude of the electric current to be measured. The magnetism detector element is, e.g., a Hall element using the Hall effect, an AMR element using an anisotropic magnetoresistive (AMR) effect, a GMR element using a giant magnetoresistive (GMR) effect or a TMR element using a tunnel magnetoresistive (TMR) effect, etc.

The magnetism detector elements are arranged closed to an electric current path of a measuring object, and wires for inputting/outputting signals to/from the magnetism detector elements are also arranged closed to the electric current path. Therefore, when the current value in the electric current path varies at a high frequency of about several tens kHz to several hundred kHz, induced electromotive force occurs between the wires of the magnetism detector elements and induced electromotive force noise is superimposed on the outputs of the magnetism detector elements, causing a decrease in detection accuracy. Conventionally, when two magnetism detector elements are used, impedances of conductive patterns of two output wires are adjusted so that the noise component clue to voltage variation is cancelled (see, e.g., PTL 1).

CITATION LIST

Patent Literature

[PTL 1]
JP-A-2012-225872

SUMMARY OF INVENTION

Technical Problem

In the current sensor described in PTL 1, two magnetism detector elements are arranged on a main surface of a circuit board which is arranged so that the main surface thereof is substantially orthogonal to the extending direction of the current-carrying wire. Therefore, both the magnetism detector elements and the circuit board spread out in a plane substantially orthogonal to the current-carrying wire and this binders downsizing of the device. Especially in case that plural electric current paths are arranged in parallel such as in the cane of electric current paths for supplying electric currents to a three-phase motor, the size of the electric current detection device in an alignment direction of the electric current paths is desirably reduced as much as possible.

In addition, in the current sensor described in PTL 1, only the output wires of the magnetism detector elements are taken into consideration, but any other wires such as a drive current wire or a ground wire are not taken into consideration.

It is an object of the invention to provide an electric current detection device and an electric current detection method by which a more compact device is possible and it is possible to reduce induced electromotive force noise by induced electromotive force between wires.

Solution to Problem

To solve the above-mentioned problems, the invention provides an electric current detection device comprising:
  magnetism detector elements for detecting a strength of a magnetic field generated by an electric current flowing through an electric current path;
  a detection circuit for detecting a magnitude of an electric current flowing through the electric current path based on an output of the magnetism detector elements; and
  a plurality of wires that are connected to the magnetism detector elements and extend in a direction away from the electric current path,
  wherein the magnetism detector elements are arranged such that a direction of a magneto-sensitive axis lies on a first plane parallel to a current-carrying direction of the electric current path and parallel to an extending direction of the plurality of wires, and
  wherein the plurality of wires are arranged on a same plane of a second plane orthogonal to the first plane.

To solve the above-mentioned problems, the invention also provides an electric current detection method comprising:
  providing magnetism detector elements for detecting a strength of a magnetic field generated by an electric current flowing through an electric current path and a plurality of wires that are connected to the magnetism detector elements and extend in a direction away from the electric current path;
  arranging the magnetism detector elements such that a directions of a magneto-sensitive axis thereof lies on a first plane parallel to a current-carrying direction of the electric current path and parallel to an extending direction of the plurality of wires;
  arranging the plurality of wires on a same plane of a second plane orthogonal to the first plane; and
  detecting a magnitude of an electric current flowing through the electric current path based on an output of the magnetism detector elements.

Advantageous Effects of Invention

Based on the invention, it is possible to provide an electric current detection device and an electric current detection method by which a more compact device is possible and it is possible to reduce induced electromotive force noise by induced electromotive force between wires. Thus, by a compact configuration, it is possible to highly accurately detect a magnetic field generated by an electric current flowing through an electric current path and thereby possible to accurately detect the electric current flowing through the electric current path.

DESCRIPTION OF EMBODIMENTS

First Embodiment

Figure 1:
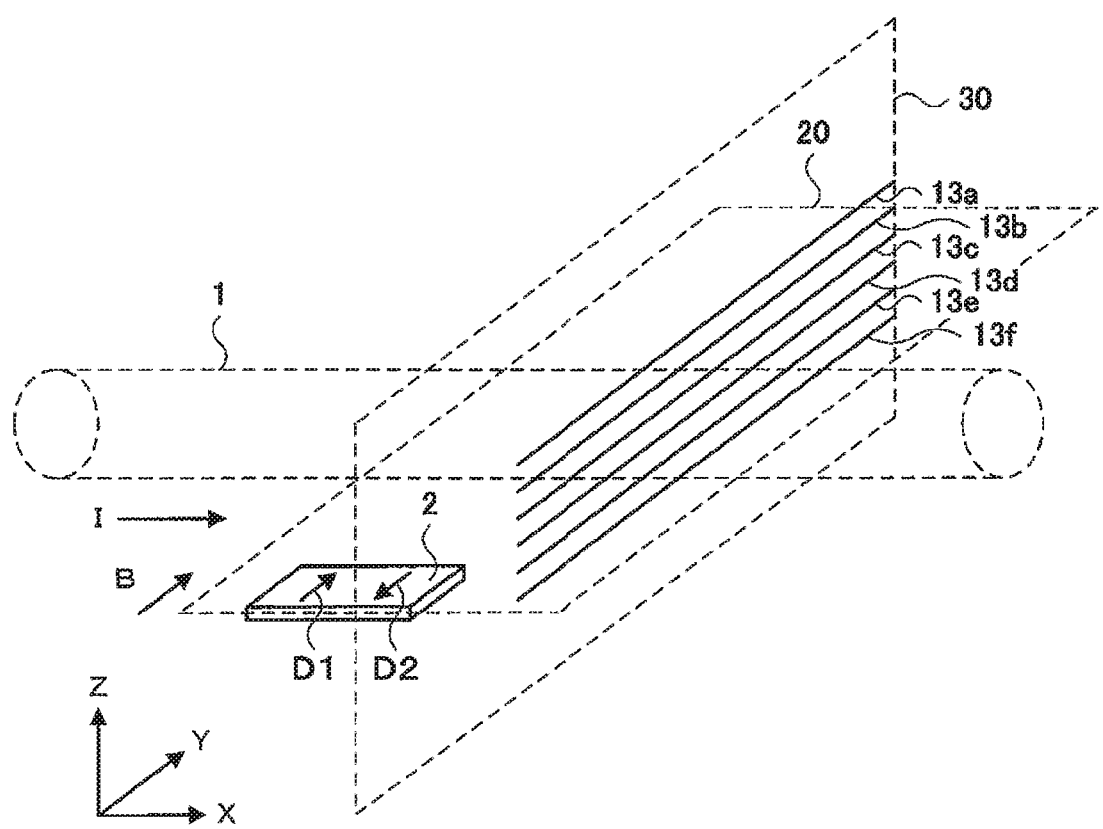
FIG. 1 is an explanatory diagram illustrating an electric current detection device in the first embodiment of the present invention.

FIG. 1 is an explanatory diagram illustrating an electric current detection device in the first embodiment of the invention. When an electric current flows in the direction of the arrow I (in the X-direction) through an electric current path 1 indicated by a dotted line, a magnetic field in the direction of the arrow B (in the Y-direction) is generated at a position immediately below the electric current path 1. The magnetism detection portion 2 of the electric current detection device detects strength of the magnetic field generated by the electric current flowing through the electric current path 1.

The magnetism detection portion 2 has one or plural magnetism detector elements each of which has a magneto-sensitive axis in the direction of the arrow D1 (the positive Y-direction) or in the direction of the arrow D2 (the negative Y-direction).

Plural wires 13a, 13b, 13c, 13d, 13e and 13f connected to the magnetism detector elements and extending in a direction away from the electric current path 1 are provided in the vicinity of the magnetism detection portion 2. In the first embodiment, each of the wires 13a, 13b, 13c, 13d, 13e and 13f extends in the Y-direction which is orthogonal to the current-carrying direction of the electric current path 1 (the X-direction).

A first plane 20 parallel to the current-carrying direction of the electric current path 1 (the X-direction) as well as parallel to the extending direction of the wires 13a, 13b, 13c, 13d, 13e and 13f (the Y-direction in the first embodiment) is indicated by a dotted line in FIG. 1. In the first embodiment, the first plane 20 is a plane extending in the X-direction and the Y-direction. A second plane 30 orthogonal to the current-carrying direction of the electric current path 1 (the X-direction) is also indicated by a dotted line in FIG. 1. In the first embodiment, the second plane 30 is a plane extending in the Y-direction and the Z-direction.

The magnetism detector elements of the magnetism detection portion 2 are arranged so that the directions of the magneto-sensitive axes (the directions of the arrows D1 and D2) lie in the first plane 20. Meanwhile, the wires 13a, 13b, 13c, 13d, 13e and 13f are arranged on the same plane of the second plane 30.

Since the magnetism detector elements of the magnetism detection portion 2 are arranged so that the directions of the magneto-sensitive axes lie in the first plane 20, it is possible to reduce the size in a direction orthogonal to the current-carrying direction of the electric current path 1 (the X-direction) as well as orthogonal to the extending direction of the plural wires 13a, 13b, 13c, 13d, 13e and 13f (the Y-direction in the first embodiment) (it is possible to reduce the size in the Z-direction) as compared to when the magnetism detector elements are arranged in the second plane 30 (as compared to, e.g., PTL 1). Especially in case that plural electric current paths are arranged in parallel such as in the case of electric current paths for supplying electric currents to a three-phase motor, the size of the electric current detection device in an alignment direction of the electric current paths is desirably reduced as much as possible.

Meanwhile, since the wires 13a, 13b, 13c, 13d, 13e and 13f are arranged on the same plane of the second plane 30, induced electromotive force noise caused by induced electromotive force between wires is reduced as compared to when plural wires are arranged in the first plane 20. That is, when plural wires are arranged in the first plane 20, a magnetic field generated due to variation in the value of the electric current flowing through the electric current path 1 intersects the first plane 20 between wires at a position away in the Y-direction from directly under the electric current path 1. This forms a loop between the wires and induced electromotive force occurs. On the other hand, when plural wires are arranged on the same plane of the second plane 30, the magnetic field does not intersect the first plane 20 between the wires and induced electromotive force between the wires is thus prevented from occurring.

Meanwhile, the magnetism detector elements of the magnetism detection portion 2 are arranged so that the directions of the magneto-sensitive axes (the directions of the arrows D1 and D2) are along the same direction as or the opposite direction to the direction of the magnetic field generated by the electric current flowing through the electric current path 1. As a result, the magnetic field generated by the electric current flowing through the electric current path 1 is detected with higher sensitivity than when the directions of the magneto-sensitive axes intersect the direction of the magnetic field. The directions of the magneto-sensitive axes of the magnetism detector elements preferably lie in the first plane 20 and extend along the second plane 30, but may be slightly inclined by up to about ±10° relative to the second plane 30.

(Functions and Effects of the First Embodiment)

The following functions and effects are obtained in the first embodiment described above.

(1) Since the magnetism detector elements of the magnetism detection portion 2 are arranged so that the directions of the magneto-sensitive axes lie in the first plane 20 which is parallel to the current-carrying direction of the electric current path 1 (the X-direction) and also parallel to the extending direction of the wires 13a, 13b, 13c, 13d, 13e and 13f (the Y-direction), it is possible to reduce the size in a direction orthogonal to the current-carrying direction of the electric current path 1 (the X-direction) as well as orthogonal to the extending direction of the plural wires 13a, 13b, 13c, 13d, 13e and 13f (the Y-direction) (it is possible to reduce the size in the Z-direction). In addition, since the wires 13a, 13b, 13c, 13d, 13e and 13f are arranged on the same plane of the second plane 30 which is orthogonal to the current-carrying direction of the electric current path 1 (the X-direction), induced electromotive force noise caused by induced electromotive force between wires is reduced. Thus, with a compact configuration, it is possible to highly accurately detect a magnetic field generated by an electric current flowing through the electric current path 1 and thereby possible to accurately detect the electric current flowing through the electric current path 1.

(2) Since the directions of the magneto-sensitive axes (the directions of the arrows D1 and D2) of the magnetism detector elements of the magnetism detection portion 2 are along the same direction as or the opposite direction to the direction of the magnetic field generated by the electric current flowing through the electric current path 1, the magnetic field generated by the electric current flowing through the electric current path 1 can be detected with high sensitivity.

(3) The wires 13a, 13b, 13c, 13d, 13e and 13f are arranged on the same plane of the second plane 30 which is orthogonal to the current-carrying direction of the electric current path 1 (the X-direction). Therefore, when the wires 13a, 13b, 13c, 13d, 13e and 13f are extended to the respective desired positions, the required wire length is minimized and this allows further downsizing of the device.

Example 1

Figure 2:
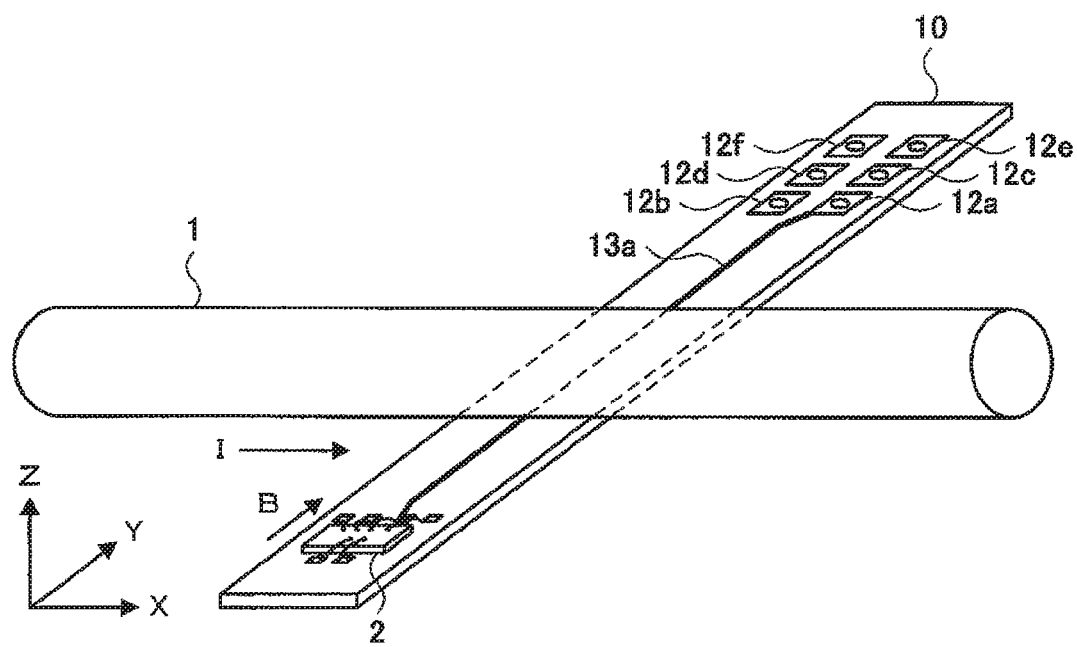
FIG. 2 is a perspective view showing an electric current detection device in Example 1 of the invention.

FIG. 2 is a perspective view showing an electric current detection device in Example 1 of the invention. Example 1 corresponds to the first embodiment and is configured that the magnetism detection portion 2 having the magnetism detector elements is mounted on the circuit board 10 having a multilayer structure composed of plural wiring layers on which the plural wires 13a, 13b, 13c, 13d, 13e and 13f are provided.

The circuit board 10 is arranged under the electric current path 1 through which an electric current flows in the direction of the arrow I (the X-direction). The magnetism detection portion 2 having the magnetism detector elements (described later) is mounted on the circuit board 10, and the magnetism detector elements of the magnetism detection portion 2 are arranged so that the directions of the magneto-sensitive axes lie in the first plane 20 shown in FIG. 1. The circuit board 10 also lies in the first plane 20 shown in FIG. 1.

Figure 3:
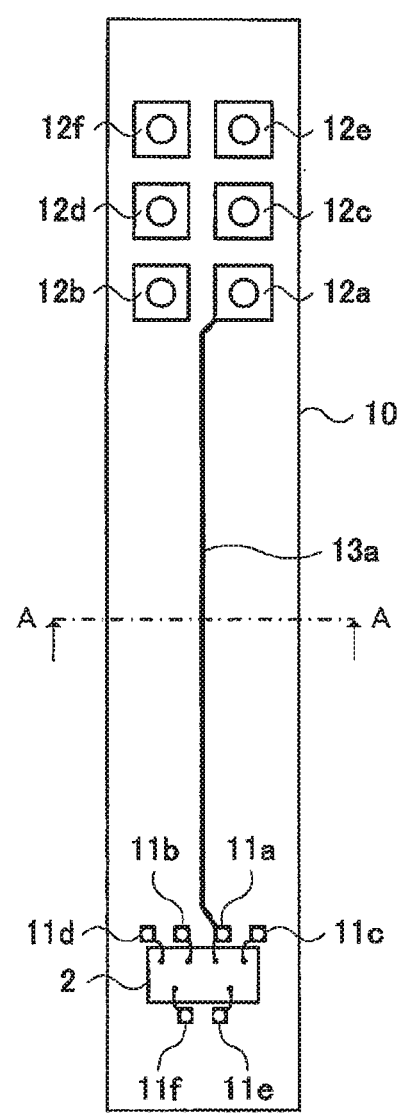
FIG. 3 is a top view showing the electric current detection device in Example 1 of the invention.

FIG. 3 is a top view showing the electric current detection device in Example 1 of the invention. Plural first terminals 11a, 11b, 11c, 11d, 11e and 11f connected to the magnetism detector elements of the magnetism detection portion 2 and plural second terminals 12a, 12b, 12c, 12d, 12e and 12f for inputting/outputting signals to/from the magnetism detector elements are provided on the upper surface of the circuit board 10. The plural wires 13a, 13b, 13c, 13d, 13e and 13f are also provided on the circuit board 10 and connects the plural first terminals 11a, 11b, 11c, 11d, 11e and 11f to the plural second terminals 12a, 12b, 12c, 12d, 12e and 12f. Among the plural wires, only the wire 13a is arranged on the upper surface of the circuit board 10.

Figure 4:
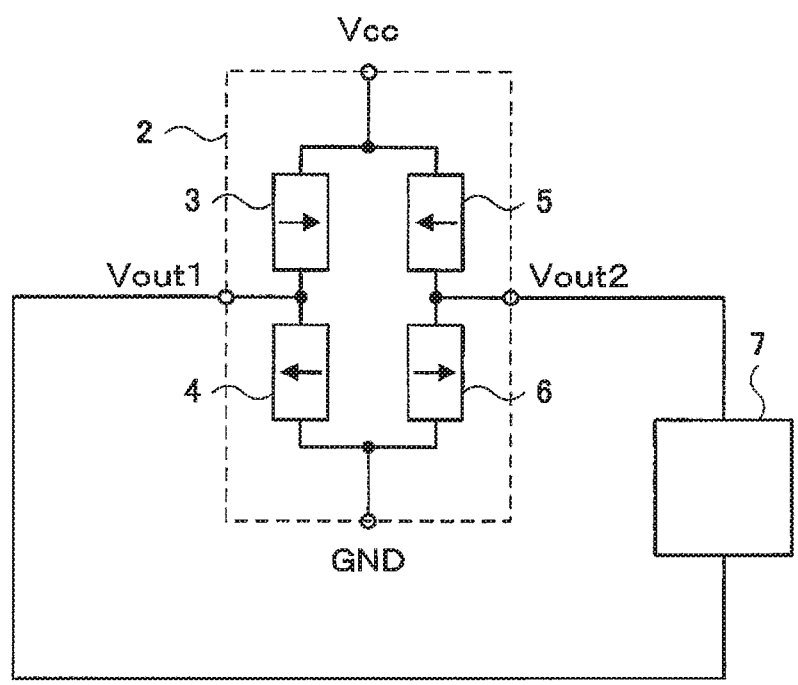
FIG. 4 is a diagram illustrating a configuration of a magnetism detection portion 2.

FIG. 4 is a diagram illustrating a configuration of the magnetism detection portion 2. In Example 1, the magnetism detection portion 2 has a flail-bridge configuration of four magnetism detector elements 3, 4, 5 and 6. Each of the magnetism detector elements 3, 4, 5 and 6 is constructed from a GMR element and detects strength of a magnetic field generated by an electric current flowing through an electric current path.

The GMR element has a higher sensitivity than the Hall element. In more detail, while the minimum detectable magnetic field sensitivity of the Hall element is 0.5 Oe (0.05 mT in terms of magnetic flux density in the air), that of the GivER element is 0.02 Oe (0.002 mT in terms of magnetic flux density in the air). In addition, the response speed of the GMR element is faster than other magnetism detector elements such as the Hall element. Furthermore, unlike, e.g., a coil, etc., which senses a change in a magnetic field, the GMR element directly detects the magnetic field itself and thus can be highly responsive to even a very small change in the magnetic field. Therefore, use of the GMR element as the magnetism detector elements 3, 4, 5 and 6 improves accuracy of detecting a magnetic field generated by an electric current flowing through an electric current path.

The magnetism detector elements 3 and 4 are connected in series, and the magnetism detector elements 5 and 6 are connected in series. Then, a junction of the series-connected magnetism detector elements 3 and 4 is connected parallel to a junction of the series-connected magnetism detector elements 5 and 6.

The magnetism detector elements 3 and 6, which are located on a diagonal, are arranged so that the directions of the magneto-sensitive axes indicated by the arrows are both the same. The magnetism detector elements 4 and 5, which are located on another diagonal, are arranged so that the directions of the magneto-sensitive axes indicated by the arrows are both the same and are opposite to the directions of the magneto-sensitive axes of the magnetism detector elements 3 and 6.

Between a terminal Vcc and a terminal GND, drive voltage is applied to the junction of the series-connected magnetism detector elements 3 and 4 and to the junction of the series-connected magnetism detector elements 5 and 6. A first output is sent from a terminal Vout1 between the magnetism detector elements 3 and 4, and a second output is sent from a terminal Vout2 between the magnetism detector elements 5 and 6. A detection circuit 7 detects the magnitude of the electric current flowing through the electric current path 1 based on a difference between the first output sent from the terminal Vout1 and the second output sent from the terminal Vout2.

On the magnetism detection portion 2, a bias coil (not shown) for generating a bias magnetic field to be applied to the GMR element is further provided and two terminals (not shown) are also provided to apply voltage to the bias coil. Thus, six terminals in total are provided on the magnetism detection portion 2 in Example 1.

Referring to FIG. 3, the first terminal 11a is connected to, e.g., the terminal Vcc. The first terminal 11b is connected to, e.g., the terminal GND. The first terminal 11c is connected to, e.g., the terminal Vout1. The first terminal 11d is connected to, e.g., the terminal Vout2. The first terminals 11e and 11f are respectively connected to, e.g., the terminals for the bias coil. The respective terminals of the magnetism detection portion 2 are connected to the first terminals 11a, 11b, 11c, 11d, 11e and 11f by, e.g., wire bonding, etc.

Figure 5:
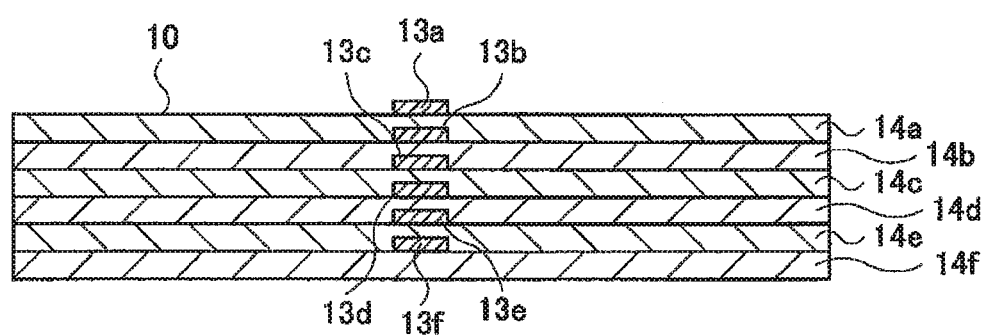
FIG. 5 is a cross sectional view taken along a line A-A in FIG. 3.

FIG. 5 is a cross sectional view taken along a line A-A in FIG. 3. The circuit board 10 has a multilayer structure composed of plural wiring layers 14a, 14b, 14c, 14d, 14e and 14f. In Example 1, each of the wiring layers 14a, 14b, 14c, 14d, 14e and 14f has a thickness of e.g., about 0.2 mm. The wire 13a is arranged on the wiring layer 14a. The wire 13b is arranged on the wiring layer 14b. The wire 13c is arranged on the wiring layer 14c. The wire 13d is arranged on the wiring layer 14d. The wire 13e is arranged on the wiring layer 14e. The wire 13f is arranged on the wiring layer 14f. An insulating material is provided on each of the wires 13a, 13b, 13c, 13d, 13e and 13f on the wiring layers 14a, 14b, 14c, 14d, 14e and 14f.

The wires 13a, 13b, 13c, 13d, 13e and 13f are arranged at the same lateral position in the drawing and on the same plane of the second plane 30 shown in FIG. 1. That is, the plural wires 13a, 13b, 13c, 13d, 13e and 13f are arranged on the wiring layers 14a, 14b, 14c, 14d, 14e and 14f of the circuit board 10 so as to be spaced from each other in a thickness direction of the circuit board 10.

Meanwhile, the wires connected to the bias coil for the magnetism detector elements 3, 4, 5 and 6 do not need to be arranged at the same position as other wires. Therefore, when, e.g., the wires 13e and 13f are connected to the bias coil, the wires 13e and 13f may be arranged on any of the wiring layers 14a, 14b, 14c and 14d so as to be parallel to the other wire on the same layer.

Figure 6:
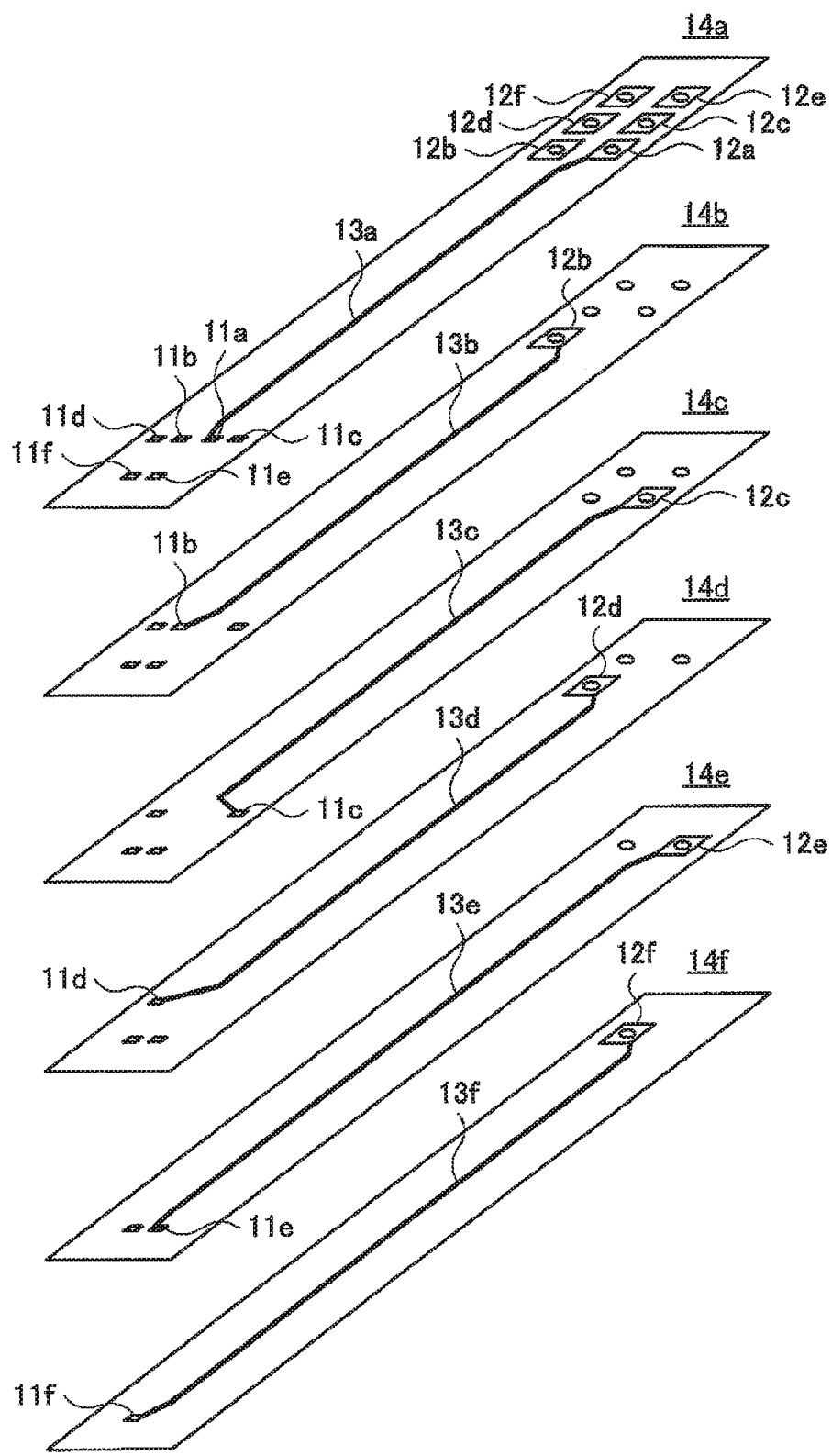
FIG. 6 is a diagram illustrating each of wiring layers of a circuit board 10.

FIG. 6 is a diagram illustrating each of the wiring layers of the circuit board 10. FIG. 6 is a perspective view in the state that the plural wiring layers 14a, 14b, 14c, 14d, 14e and 14f shown in FIG. 5 are separated and vertically arranged. The wire 13a on the wiring layer 14a is connected at one end to the first terminal 11a and at the other end to the second terminal 12a.

The wire 13b on the wiring layer 14b is connected at one end to the first terminal 11b and at the other end to the second terminal 12b. The first terminal 11b of the wiring layer 14b and the first terminal 11b of the wiring layer 14a are connected through a through-hole which is provided in the thickness direction of the circuit board 10. Also, the second terminal 12b of the wiring layer 14b and the second terminal 12b of the wiring layer 14a are connected through another through-hole which is provided in the thickness direction of the circuit board 10.

The wire 13c on the wiring layer 14c is connected at one end to the first terminal 11c and at the other end to the second terminal 12c. The first terminal 11c of the wiring layer 14c and the first terminal 11c of the wiring layer 14a are connected through a through-hole which is provided in the thickness direction of the circuit board 10. Also, the second terminal 12c of the wiring layer 14c and the second terminal 12c of the wiring layer 14a are connected through another through-hole which is provided in the thickness direction of the circuit board 10. The other wiring layers 14d to 14f are configured in the same manner.

Effects of Example 1

In Example 1 described above, since the magnetism detector elements 3, 4, 5 and 6 are mounted on the circuit board 10 having a multilayer structure composed of plural wiring layers and the plural wires 13a, 13b, 13c, 13d, 13e and 13f are arranged on the plural wiring layers of the circuit board 10 so as to be spaced from each other in the thickness direction of the circuit board 10, it is possible to further reduce the size in a direction orthogonal to the current-carrying direction of the electric current path 1 (the X-direction) as well as orthogonal to the extending direction of the plural wires 13a, 13b, 13c, 13d, 13e and 13f (the Y-direction) (it is possible to further reduce the size in the Z-direction).

Second Embodiment

Figure 7:
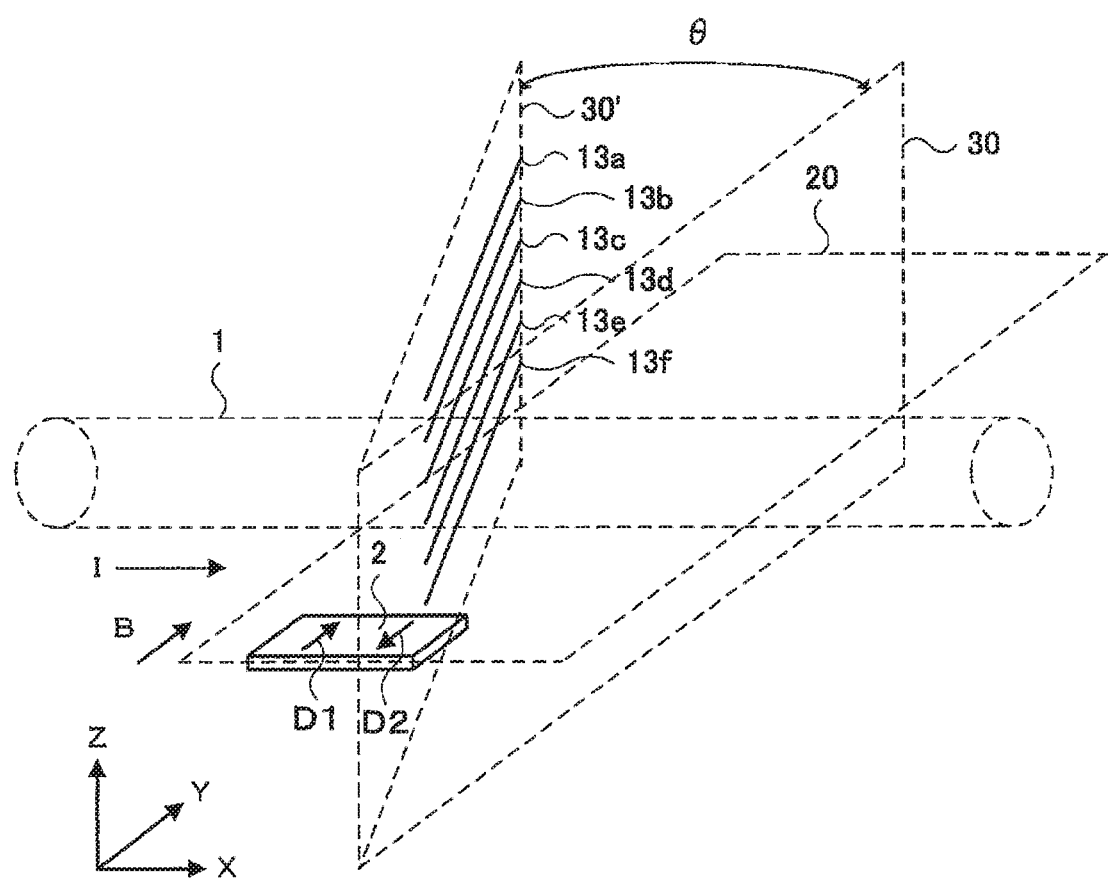
FIG. 7 is an explanatory diagram illustrating an electric current detection device in the second embodiment of the invention.

FIG. 7 is an explanatory diagram illustrating an electric current detection device in the second embodiment of the invention. In the second embodiment, each of the wires 13a, 13b, 13c, 13d, 13e and 13f extends in a direction inclined by an angle θ in the X-direction relative to the Y-direction which is orthogonal to the current-carrying direction of the electric current path 1 (the X-direction). A second plane 30' inclined by the angle θ in the X-direction relative to the second plane 30 which is orthogonal to the current-carrying direction of the electric current path 1 (the X-direction) is indicated by a dotted line in FIG. 7. The wires 13a, 13b, 13c, 13d, 13e and 13f are arranged on the same plane of the second plane 30'. The remaining configuration is the same as the first embodiment shown in FIG. 1.

Since the magnetism detector elements of the magnetism detection portion 2 are arranged so that the directions of the magneto-sensitive axes lie in the first plane 20, it is possible to reduce the size in a direction orthogonal to the current-carrying direction of the electric current path 1 (the X-direction) as well as orthogonal to the extending direction of the wires 13a, 13b, 13c, 13d, 13e and 13f (a direction inclined by the angle θ in the X-direction relative to the Y-direction in the second embodiment) (it is possible to reduce the size in the Z-direction).

In addition, since the wires 13a, 13b, 13c, 13d, 13e and 13f are arranged on the same plane of the second plane 30', induced electromotive force noise caused by induced electromotive force between wires is reduced as compared to when plural wires are arranged in the first plane 20.

(Functions and Effects of the Second Embodiment)

The same functions and effects as the (1) and (2) described in the first embodiment are obtained in the second embodiment.

Furthermore, since the wires 13a, 13b, 13c, 13d, 13e and 13f are arranged in the second plane 30' which is inclined by the angle θ in the current-carrying direction of the electric current path 1 (the X-direction) relative to the second plane 30 orthogonal to the current-carrying direction of the electric current path 1 (the X-direction), it is possible to extend the wires 13a, 13b, 13c, 13d, 13e and 13f in a desired direction and this increases the degree of freedom of the device configuration.

Example 2

Figure 8:
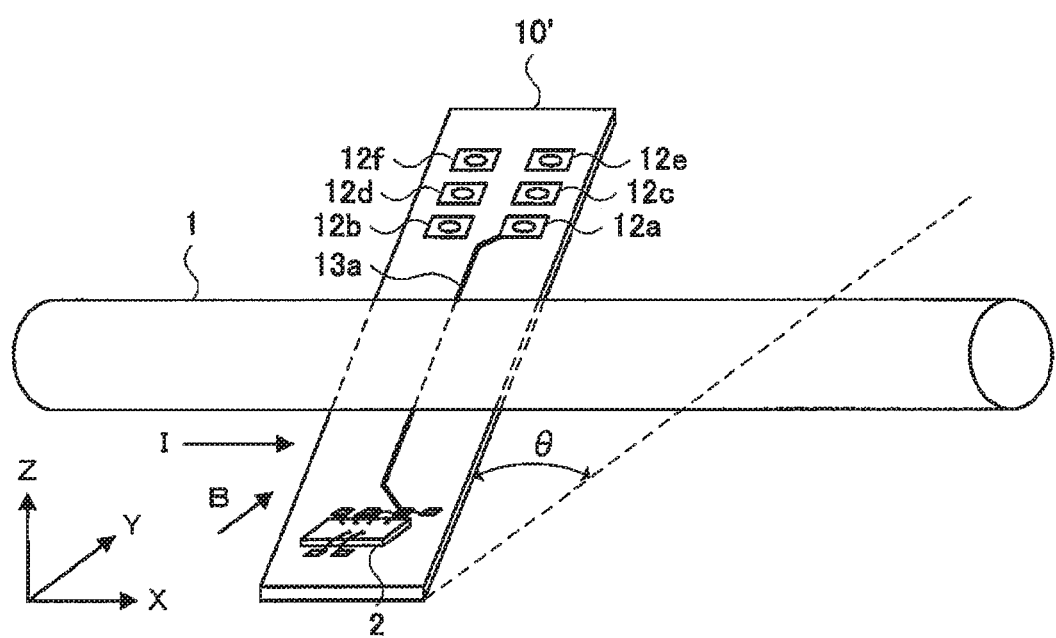
FIG. 8 is a perspective view showing an electric current detection device in Example 2 of the invention.

FIG. 8 is a perspective view showing an electric current detection device in Example 2 of the invention. Example 2 corresponds to the second embodiment and is configured that the magnetism detection portion 2 having the magnetism detector elements is mounted on a circuit board 10' having a multilayer structure composed of plural wiring layers on which the plural wires 13a, 13b, 13c, 13c, 13e and 13f are provided.

In Example 1 shown in FIG. 2, the circuit board 10 is arranged so that the longitudinal direction thereof coincides with the Y-direction. Meanwhile, the circuit board 10' in Example 2 is arranged so that the longitudinal direction thereof is along a direction inclined by an angle θ in the X-direction relative to the Y-direction.

Figure 9:
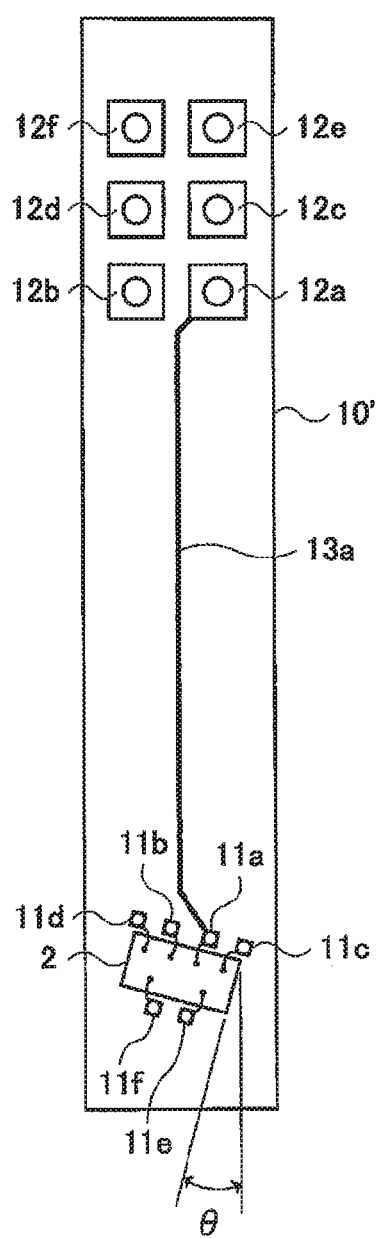
FIG. 9 is a top view showing the electric current detection device in Example 2 of the invention.

FIG. 9 is a top view showing the electric current detection device in Example 2 of the invention. The magnetism detection portion 2 is mounted on the circuit board 10' so as to be inclined by an angle θ relative to the extending direction of the wires 13a, 13b, 13c, 13d, 13e and 13f. As a result, even when the wires 13a, 13b, 13c, 13d, 13e and 13f are arranged to extend in a direction inclined by the angle θ in the X-direction relative to Y-direction which is orthogonal to the current-carrying direction of the electric current path 1 (the X-direction), the magneto-sensitive axes of the magnetism detector elements of the magnetism detection portion 2 can be the same direction as or the opposite direction to the direction of the magnetic field generated by the electric current flowing through the electric current path 1. The multilayer structure of the circuit board 10' is the same as the structure in Example 1 shown in FIGS. 5 and 6.

(Effects of Example 2)

The same effects as Example 1 are obtained in Example 2 described above.

Summary of Embodiments

Technical ideas understood from the embodiments will be described below citing the reference numerals, etc., used for the embodiments. However, each reference numeral described below is not intended to limit the constituent elements in the claims to the members, etc., specifically described in the embodiments.

[1] An electric current detection device comprising: magnetism detector elements (3, 4, 5, 6) for detecting a strength of a magnetic field generated by an electric current flowing through an electric current path (1); a detection circuit (7) for detecting a magnitude of an electric current flowing through the electric current path (1) based on an output of the magnetism detector elements (3, 4, 5, 6); and a plurality of wires (13a, 13b, 13c, 13d, 13e, 13f) that are connected to the magnetism detector elements (3, 4, 5, 6) and extend in a direction away from the electric current path (1), wherein the magnetism detector elements (3, 4, 5, 6) are arranged such that a direction of a magneto-sensitive axis thereof lies on a first plane (20) parallel to a current-carrying direction of the electric current path (1) and parallel to an extending direction of the plurality of wires (13a, 13b, 13c, 13d, 13e, 13f), and the plurality of wires (13a, 13b, 13c, 13d, 13e, 13f) are arranged on a same plane of a second plane (30/30') orthogonal to the first plane (20).

[2] The electric current detection device defined by [1], wherein the second plane (30) is orthogonal to the current-carrying direction of the electric current path (1).

[3] The electric current detection device defined by [1], wherein the second plane (30') is inclined in the current-carrying direction of the electric current path (1) relative to a plane orthogonal to the current-carrying direction of the electric current path (1).

[4] The electric current detection device comprising: a circuit board (10/10') mounting the magnetism detector elements (3, 4, 5, 6), wherein the circuit board (10/10') comprises a multilayer structure comprising a plurality of wiring layers, and the plurality of wires (13a, 13b, 13c, 13d, 13e, 13f) are arranged on the plurality of wiring layers of the circuit board (10/10') so as to be spaced from each other in a thickness direction of the circuit board (10/10').

[5] An electric current detection method comprising: providing magnetism detector elements (3, 4, 5, 6) for detecting a strength of a magnetic field generated by an electric current flowing through an electric current path (1) and a plurality of wires (13a, 13b, 13c, 13d, 13e, 13f) that are connected to the magnetism detector elements (3, 4, 5, 6) and extend in a direction away from the electric current path (1); arranging the magnetism detector elements (3, 4, 5, 6) such that a direction of a magneto-sensitive axis lies on a first plane (20) parallel to the current-carrying direction of the electric current path (1) and parallel to an extending direction of the plurality of wires (13a, 13b, 13c, 13d, 13e, 13f); arranging the plurality of wires (13a, 13b, 13c, 13d, 13e, 13f) on a same plane of a second plane (30/30') orthogonal to the first plane (20); and detecting a magnitude of an electric current flowing through the electric current path (1) based on an output of the magnetism detector elements (3, 4, 5, 6).

[6] The electric current detection method defined by [5], wherein the second plane (30) is orthogonal to the current-carrying direction of the electric current path (1).

[7] The electric current detection method defined by [5], wherein the second plane (30') is inclined in the current-carrying direction of the electric current path (1) relative to a plane orthogonal to the current-carrying direction of the electric current path (1).

[8] The electric current detection method, wherein the magnetism detector elements (3, 4, 5, 6) are mounted on a circuit board (10/10') comprising a multilayer structure comprising a plurality of wiring layers, and the plurality of wires (13a, 13b, 13c, 13d, 13e, 13f) are arranged on the plurality of wiring layers of the circuit board (10/10') so as to be spaced from each other in a thickness direction of the circuit board (10/10').

Although the embodiments of the invention have been described, the invention according to claims is not to be limited to the embodiments. Further, please note that all combinations of the features described in the embodiments are not necessary to solve the problem of the invention.

The invention can be appropriately modified and implemented without departing from the gist thereof. For example, although the GMR elements are used as the magnetism detector elements 3, 4, 5 and 6 in Examples, other magnetism detector elements, e.g., Hall elements, AMR elements or TMR elements, etc., may be alternatively used. In addition, although four magnetism detector elements 3, 4, 5 and 6 are provided in Examples, the number of the magnetism detector elements is not limited thereto.

In addition, although six wires 13a, 13b, 13c, 13d, 13e and 13f are provided in the embodiments described above, the number of the wires is not limited thereto. The invention is applicable to devices having plural wires connected to the magnetism detector elements.

The circuit board 10/10' and the wires 13a, 13b, 13c, 13d, 13e and 13f are provided to linearly separate from the electric current path in the embodiments, but may be provided to separate from the electric current path non-linearly, e.g., in a circular manner, saw-tooth manner or comb-tooth manner, etc.

REFERENCE SIGNS LIST

1: ELECTRIC CURRENT PATH
2: MAGNETISM DETECTION PORTION
3, 4, 5, 6: MAGNETISM DETECTOR ELEMENT
7: DETECTION CIRCUIT
10, 10': CIRCUIT BOARD
11a, 11b, 11c, 11d, 11e, 11f: FIRST TERMINAL
12a, 12b, 12c, 12d, 12e, 12f: SECOND TERMINAL
13a, 13b, 13c, 13d, 13e, 13f: WIRE
14a, 14b, 14c, 14d, 14e, 14f: WIRING LAYER
20: FIRST PLANE
30, 30': SECOND PLANE

The invention claimed is:
1. An electric current detection device, comprising:
magnetism detector elements for detecting a strength of a magnetic field generated by an electric current flowing through an electric current path;
a detection circuit for detecting a magnitude of an electric current flowing through the electric current path based on an output of the magnetism detector elements;

a circuit board mounting the magnetism detector elements and comprising a plurality of terminals and a multilayer structure comprising a plurality of wiring layers; and a plurality of wires that are connected to the magnetism detector elements via the plurality of terminals of the circuit board and extend in a direction away from the electric current path, wherein each of the magnetism detector elements has a magneto-sensitive axis, and are arranged outside the electric current path such that a direction of each of their respective magneto-sensitive axes lies in a first plane parallel to a current-carrying direction of the electric current path and parallel to an extending direction of the plurality of wires, wherein the plurality of wires are arranged in a second plane orthogonal to the first plane, and wherein the plurality of wires are arranged on the plurality of wiring layers of the circuit board so as to be spaced from each other in a thickness direction of the circuit board.

2. The electric current detection device according to claim 1, wherein the second plane is orthogonal to the current-carrying direction of the electric current path.

3. The electric current detection device according to claim 1, wherein the second plane is inclined in the current-carrying direction of the electric current path relative to a plane orthogonal to the current-carrying direction of the electric current path.

4. An electric current detection method, comprising:

providing magnetism detector elements for detecting a strength of a magnetic field generated by an electric current flowing through an electric current path on a circuit board comprising a plurality of terminals and a multilayer structure comprising a plurality of wiring layers and a plurality of wires that are connected to the magnetism detector elements via the plurality of terminals of the circuit board and extend in a direction away from the electric current path;

arranging the magnetism detector elements outside the electric current path such that a direction of a magneto-sensitive axis of each of the magnetism detector elements lies in a first plane parallel to a current-carrying direction of the electric current path and parallel to an extending direction of the plurality of wires;

arranging the plurality of wires in a second plane orthogonal to the first plane, the plurality of wires being arranged on the plurality of wiring layers of the circuit board so as to be spaced from each other in a thickness direction of the circuit board; and detecting a magnitude of an electric current flowing through the electric current path based on an output of the magnetism detector elements.

5. The electric current detection method according to claim 4, wherein the second plane is orthogonal to the current-carrying direction of the electric current path.

6. The electric current detection method according to claim 4, wherein the second plane is inclined in the current-carrying direction of the electric current path relative to a plane orthogonal to the current-carrying direction of the electric current path.

7. The electric current detection device according to claim 1, wherein the plurality of wires are parallel to each other.

8. The electric current detection method according to claim 4, wherein the plurality of wires are parallel to each other.

* * * * *